(12) United States Patent
Gao et al.

(10) Patent No.: US 9,577,624 B2
(45) Date of Patent: Feb. 21, 2017

(54) SIGNAL CONVERSION CIRCUIT AND POWER SUPPLY APPARATUS

(71) Applicant: FUJITSU LIMITED, Kawasaki-shi, Kanagawa (JP)

(72) Inventors: Hong Gao, Inagi (JP); Hiroyuki Nakamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 42 days.

(21) Appl. No.: 14/698,303

(22) Filed: Apr. 28, 2015

(65) Prior Publication Data

US 2015/0365009 A1 Dec. 17, 2015

(30) Foreign Application Priority Data

Jun. 17, 2014 (JP) .................. 2014-124265

(51) Int. Cl.
  *H02M 5/458* (2006.01)
  *H03K 5/1536* (2006.01)
  *H03K 5/08* (2006.01)
  *H02M 3/156* (2006.01)
  *H02M 1/00* (2006.01)

(52) U.S. Cl.
  CPC .............. *H03K 5/1536* (2013.01); *H03K 5/08* (2013.01); *H02M 3/156* (2013.01); *H02M 2001/0006* (2013.01)

(58) Field of Classification Search
  CPC ...... H02M 5/458; H02M 3/156; H03K 5/1536
  USPC ..................................... 363/34–38
  See application file for complete search history.

(56) References Cited

U.S. PATENT DOCUMENTS

| 5,017,800 A | * | 5/1991 | Divan | ..................... H02J 9/062 307/66 |
| 5,111,373 A | * | 5/1992 | Higaki | .................. H02M 5/458 363/124 |
| 5,121,317 A | * | 6/1992 | Vogler | ..................... H05G 1/20 363/136 |
| 2010/0052648 A1 | * | 3/2010 | Iwabuchi | .............. H02M 7/538 323/351 |

FOREIGN PATENT DOCUMENTS

| JP | 58-175975 A | 10/1983 |
| JP | 2000-116136 A | 4/2000 |
| JP | 2000-166244 A | 6/2000 |

* cited by examiner

*Primary Examiner* — Yemane Mehari
(74) *Attorney, Agent, or Firm* — Arent Fox LLP

(57) ABSTRACT

A power supply apparatus including: a boost converter configured to generate a power supply voltage to drive to a load circuit from a voltage received from a voltage generation unit; an oscillator configured to receive the minute voltage, and to generate an alternating current signal; and a signal conversion circuit which further includes a half-wave generation circuit configured to receive the alternating current signal, and to generate a half-wave signal of a high potential side or a low potential side, and at least one inverter configured to receive the generated half-wave signal, and to generate a pulse signal; wherein the boost converter is driven by the pulse signal output from the signal conversion circuit in order to generate the power supply voltage.

6 Claims, 11 Drawing Sheets

SIGNAL CONVERSION CIRCUIT AND POWER SUPPLY APPARATUS

CROSS-REFERENCE TO RELATED APPLICATION

This application is based upon and claims the benefit of priority of the prior Japanese Patent Application No. 2014-124265, filed on Jun. 17, 2014, the entire contents of which are incorporated herein by reference.

FIELD

The embodiments discussed herein are related to a signal conversion circuit and a power supply apparatus.

BACKGROUND

In recent years, energy harvesting in which electric power is obtained by capturing ambient energy is attracting attention. The ambient energy includes, for example, sunlight, illumination light, electromagnetic waves, and vibrations and heat from machines and human bodies.

In order to use electric power derived from such energy harvesting as a power source for a load circuit, a DC-DC converter is used, for example. The DC-DC converter raises a voltage (an ultra-low voltage of tens of mV to hundreds of mV, for example) obtained from an ultra-low voltage generation unit (a photovoltaic generator, an electromagnetic generator, a vibration power generator, a thermoelectric generator, or the like).

Here, at the time of starting the DC-DC converter (step-up or boost converter), for example, the ultra-low voltage is oscillated by an oscillator to generate an alternating sine wave signal (alternating current signal) with a sufficient amplitude. Then, a switching transistor in the step-up converter is driven by the alternating current signal. Conventionally, various types of boost converters have been proposed. Related-art techniques are disclosed in Japanese Laid-open Patent Publication Nos. 2000-116136, 58-175975, and 2000-166244.

As described above, at the time of starting a boost converter, for example, the switching transistor of the boost converter is driven using an alternating current signal generated from an oscillator. However, driven by an alternating current signal (alternating sine wave signal), the transistor cannot switch rapidly, which may lead to a low power efficiency, or the like.

Thus, we have proposed to convert the alternating current signal generated from the oscillator into a pulse signal, and to drive the switching transistor by the pulse signal. In a signal conversion circuit that converts such an alternating current signal into a pulse signal, low power consumption is demanded. However, currently, a signal conversion circuit that fully meets the low-power requirements has not yet been put into practical use.

In this regard, a description will be given mainly based on the application to energy harvesting in this specification. However, a signal conversion circuit and a power supply apparatus according to the present embodiments are not limited to the application to energy harvesting, as a matter of course.

SUMMARY

According to an aspect of the invention, a power supply apparatus includes: a boost converter configured to provide a power supply voltage for a load circuit by boosting up an ultra-low voltage generated from a voltage generation unit; an oscillator configured to receive the ultra-low voltage, and output an alternating current signal; and a signal conversion circuit which further includes a half-wave generation circuit configured to receive the alternating current signal, and generate a half-wave signal of a high potential side or a low potential side, and at least one inverter configured to receive the generated half-wave signal, and generate a pulse signal; wherein the boost converter is driven by the pulse signal output from the signal conversion circuit in order to generate the power supply voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, before a detailed description is given to a signal conversion circuit and a power source apparatus according to the present embodiments, a description will be given to examples of a related-art signal conversion circuit and power supply apparatus, and their problems with reference to FIG. 1 to FIG. 4.

Figure 1:
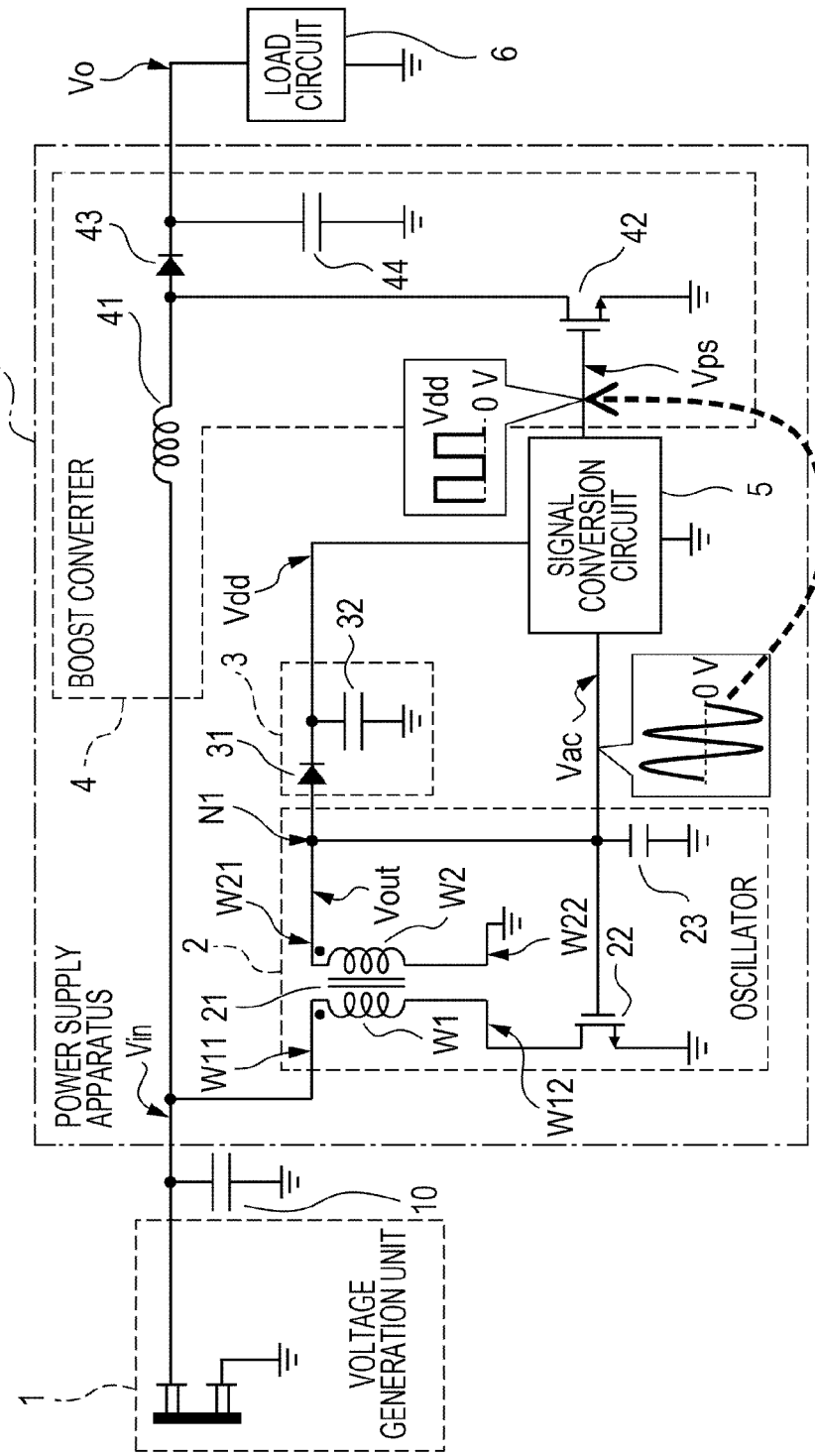
FIG. 1 is a block diagram illustrating an example of a power supply apparatus.

FIG. 1 is a block diagram illustrating an example of a power supply apparatus. In FIG. 1, reference symbol 1 denotes a voltage generation unit, reference symbol 2 denotes an oscillator, reference symbol 3 denotes a rectification circuit, reference symbol 4 denotes an electric power transmission boost converter, reference symbol 5 denotes a signal conversion circuit, and reference symbol 6 denotes a load circuit.

The voltage generation unit 1 is a photovoltaic generator, an electromagnetic generator, a vibration power generator, a thermoelectric generator, or the like. These generators generate input voltage Vin from energy sources, for example, sunlight, illumination light, electromagnetic waves, or vibrations and heat from machines and human bodies. In this regard, the photovoltaic generator, or the like is also called an energy harvester, for example.

The input voltage Vin from the voltage generation unit 1 is input into the oscillator 2, and the boost converter (DC-DC converter) 4 for electric power transmission. The oscillator 2 amplifies the input voltage Vin from the voltage generation unit 1, and outputs the voltage to the rectification circuit 3. The amplified voltage Vdd (for example, about 5 V) that has been smoothed by the rectification circuit 3 is output to the signal conversion circuit 5. Here, the rectification circuit 3 includes a diode 31, and a capacitor 32.

The boost converter 4, including an inductor 41, a switching transistor 42, a diode 43, and a capacitor 44, boost the input voltage Vin from the voltage generation unit 1 to generate an output voltage (power supply voltage) Vo, and applies the power supply voltage Vo to the load circuit 6. Here, the switching transistor 42 is controlled by a pulse signal Vps generated from the signal conversion circuit 5.

The oscillator 2 includes a transformer 21, a depletion-type nMOS transistor 22, and a capacitor 23. In this regard, in FIG. 1, black circles added to a first terminal W11 of a primary winding W1 of the transformer 21 and a first terminal W21 of the secondary winding W2 denote starting sides of the winding wires.

The first terminal W11 of the primary winding W1 of the transformer 21 is connected to one end (for example, the positive potential end) of the voltage generation unit 1, and the second terminal W12 of the primary winding W1 is connected to the drain of the transistor 22. The source of the transistor 22 is connected to the other end of the voltage generation unit 1 (for example, the negative potential end). In this regard, the source of the transistor 22, and the other end of the voltage generation unit are both grounded.

The first terminal W21 of the secondary winding W2 of the transformer 21 is connected to one end of the capacitor 23, and the gate of the transistor 22, and a second terminal W22 of the secondary winding W2 and the other end of the capacitor 23 are grounded.

In this regard, the first terminal W21 of the secondary winding W2 of the transformer 21 is also connected to a voltage output node N1, and an output voltage Vout from the voltage output node N1 is input into the rectification circuit 3 for being rectified and smoothed. That is to say, the output voltage Vout is rectified and smoothed by the diode 31 and the capacitor 32, and is applied to the signal conversion circuit 5 as the voltage Vdd for driving the signal conversion circuit 5.

Here, the turns ratio of the primary winding W1 and the secondary winding W2 in the transformer 21 is 1:N, and thus the output amplitude (the peak-to-peak value of the output voltage Vout) is amplified. In this regard, the capacitor 23 forms an LC resonant circuit together with the secondary winding W2 in order to perform oscillation operation.

Also, the transistor 22 is a native or depletion-type nMOS transistor, and thus the threshold voltage of the transistor 22 is nearly 0 V or even lower than 0 V. For example, the transistor 22 is capable of operating at a low input voltage (Vin) of about tens of mV. That is to say, it is possible to convert an ultra-low Vin generated from the voltage generation unit 1 into an alternating sine wave signal (alternating current signal) Vac with a sufficient amplitude by using the oscillator 2.

However, for example, driven by an alternating current signal (alternating sine wave signal), the transistor cannot switch rapidly, which may lead to a low power efficiency, or the like.

Accordingly, the power supply apparatus illustrated in FIG. 1 is provided with the signal conversion circuit 5 that converts the input alternating current signal Vac into the pulse signal Vps varying between the ground potential (0 V) and the voltage Vdd, for example, and outputs the pulse signal Vps.

That is to say, the oscillator 2 and the rectification circuit 3 generates the voltage Vdd for driving the signal conversion circuit 5, and the oscillator 2 generates the alternating current signal Vac to be input into the signal conversion circuit 5. The signal conversion circuit 5 converts the alternating current signal Vac from the oscillator 2 into the pulse signal Vps, which varies between the ground potential (0V) and the voltage Vdd, for example, and drives the switching transistor 42. Thereby, the transistor 42 in the boost converter 4 could be switched rapidly, thereby, making it possible to operate with high efficiency.

Figure 2:
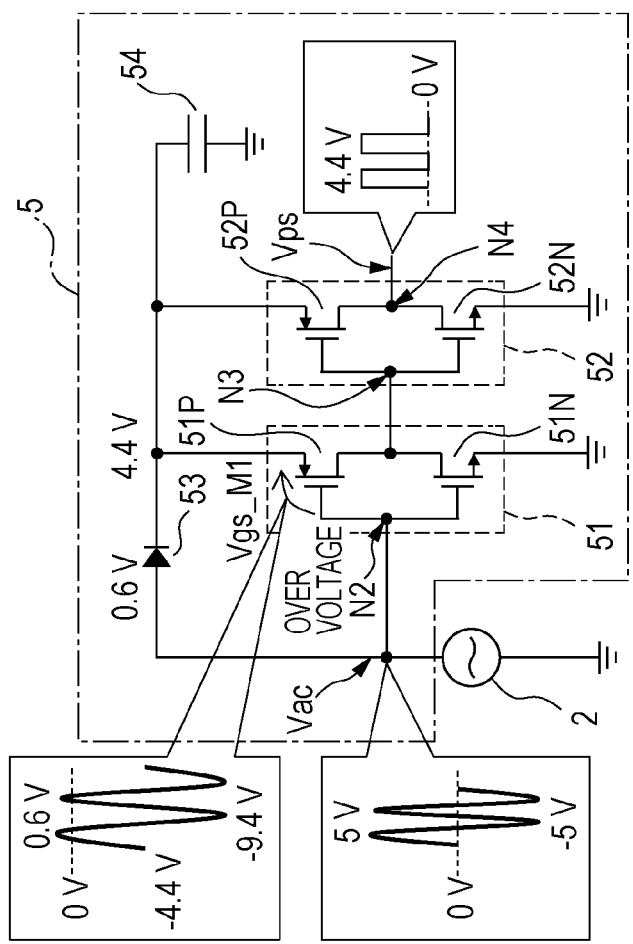
FIG. 2 is a circuit diagram illustrating an example of the signal conversion circuit.

FIG. 2 is a circuit diagram illustrating an example of the signal conversion circuit. As illustrated in FIG. 2, the signal conversion circuit 5 includes two inverters (CMOS inverters) 51 and 52, which are connected in cascade, a diode 53, and a capacitor 54.

Here, reference symbols 51P and 52P denote normally off enhancement-type pMOS transistors, and reference symbols 51N and 52N denote normally-off enhancement-type nMOS transistors.

That is to say, the alternating current signal Vac from the oscillator 2 is input into an input node N2 of the first-stage inverter 51, the output signal of the first-stage inverter 51 is input into an input node N3 of the second-stage inverter 52, and the pulse signal Vps is output from an output node N4 of the second-stage inverter 52.

Thereby, for example, the alternating sine wave signal (alternating current signal) Vac of ±5 V, which is output from the oscillator 2 is converted into the pulse signal Vps varying between 4.4 V (the voltage that is lower than the 5 V by a forward voltage drop VF (=0.6 V) of the diode 53) and 0 V (ground voltage).

Here, if attention is given to the pMOS transistor 51P of the first-stage inverter 51, the absolute value of gate-to-source voltage Vgs of the transistor 51P becomes an excess voltage close to 10 V when the alternating current signal Vac is negative, for example, and the transistor 51P might be damaged.

Figure 3:
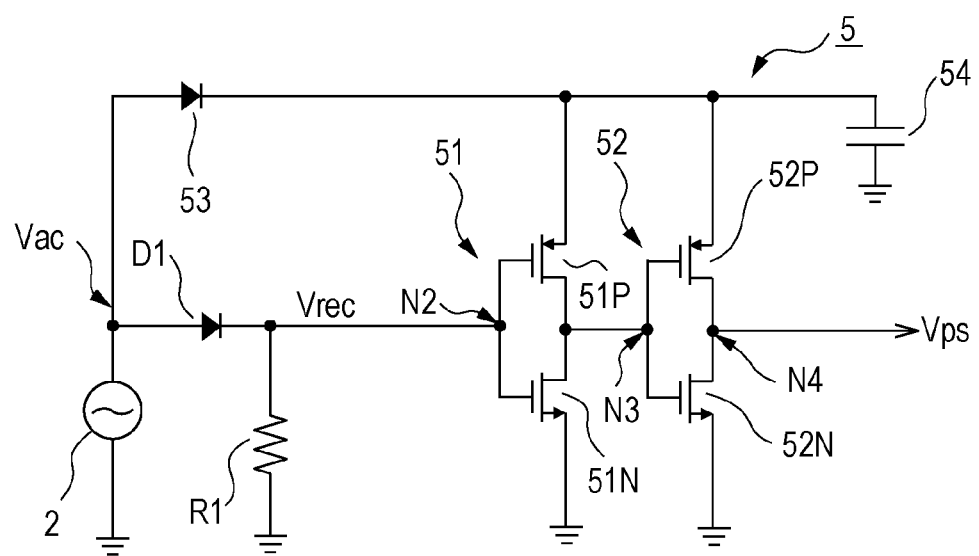
FIG. 3 is a circuit diagram illustrating another example of the signal conversion circuit.

FIG. 3 is a circuit diagram illustrating another example of the signal conversion circuit. In order not to apply an excess voltage to the transistor 51P of the first-stage inverter 51, a diode D1 and a resistor R1 are added to the signal conversion circuit in FIG. 2.

That is to say, as illustrated in FIG. 3, the alternating current signal Vac from the oscillator 2 is input into the input node N2 of the first-stage inverter 51 through the forward-direction diode D1, and the resistor R1 is inserted between the node N2 and ground.

Figure 4:
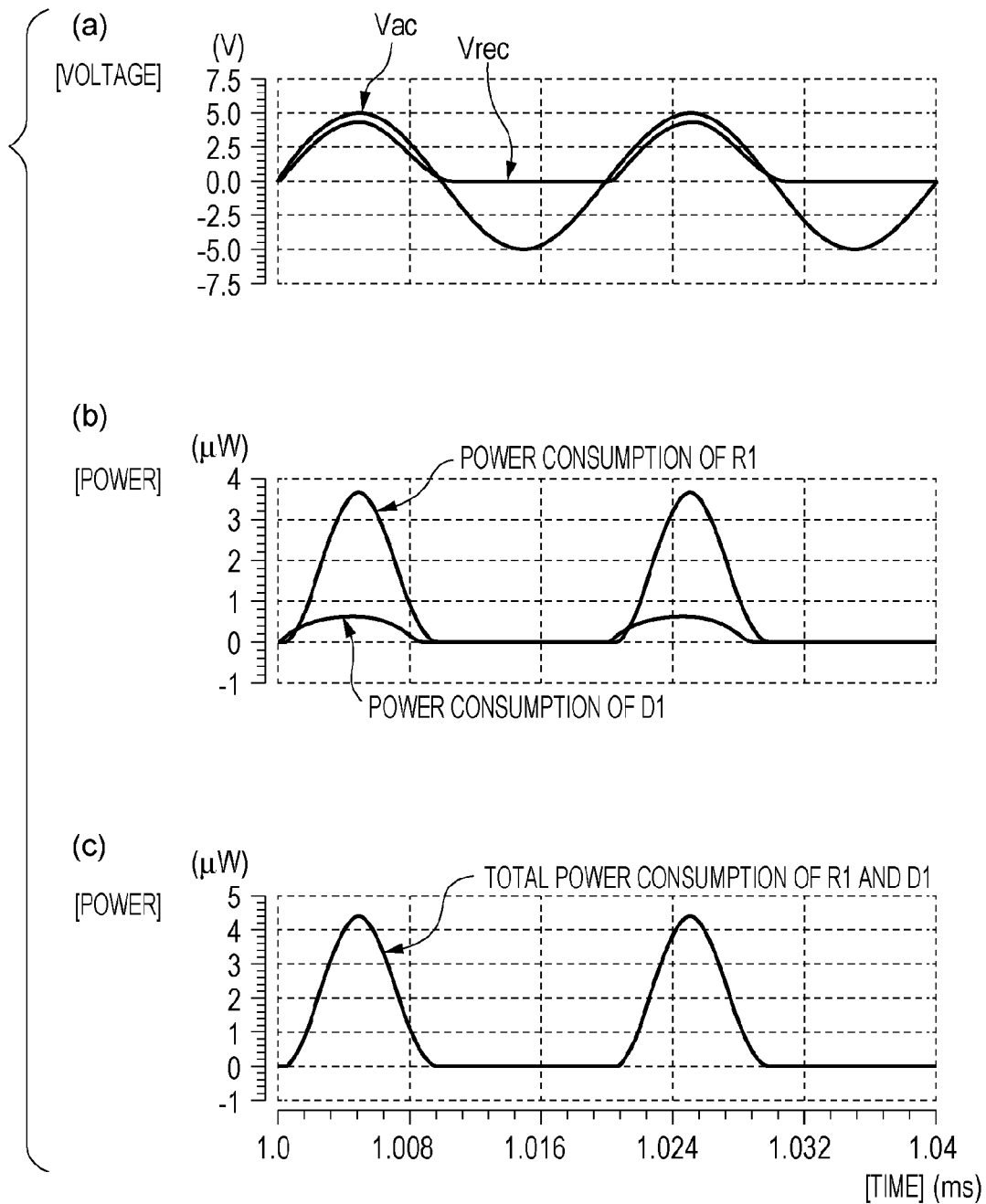
FIG. 4 is a diagram for explaining power consumption in the signal conversion circuit illustrated in FIG. 3.

FIG. 4 is a diagram for explaining power consumption of the signal conversion circuit illustrated in FIG. 3. FIG. 4(*a*) illustrates the voltage waveforms of the alternating current signal Vac of the oscillator 2, and a signal Vrec at the input node N2 of the inverter 51, and FIG. 4(*b*) illustrates the power consumption of the diode D1 and the resistor R1, respectively. Further, FIG. 4(*c*) illustrates the total power consumption of the diode D1 and the resistor R1.

As illustrated in FIG. 4(a), for example, the negative side signal of the alternating current signal Vac of ±5 V is cut off by the diode D1 and the resistor R1, and the rectified signal is input into the input node N2 of the inverter 51 as the half-wave signal Vrec that varies between 5 V and 0 V.

At this time, the diode D1 and the resistor R1 consume electric power when the alternating current signal Vac is positive. Specifically, as illustrated in FIG. 4(b), in accordance with the voltage level of the alternating current signal Vac as shown in FIG. 4(a), the power consumption of the diode D1 becomes about 0.6 μW at the maximum, and about 183.25 nW on the average of one cycle, for example. Also, the power consumption of the resistor R1 which is set as 5 MΩ as an example becomes about 3.7 μW at the maximum, and about 846.25 nW on the average of one cycle.

Accordingly, as illustrated in FIG. 4(c), the total power consumption of the diode D1 and the resistor R1 becomes approximately 1.03 μW (≈183.25 nW+846.25 nW) on the average of one cycle. This causes a big problem for its huge power consumption when the signal conversion circuit is applied to energy harvesting systems, for example. However, the demand for low-power-consuming signal conversion circuit is not limited to the field of energy harvesting.

Figure 5:
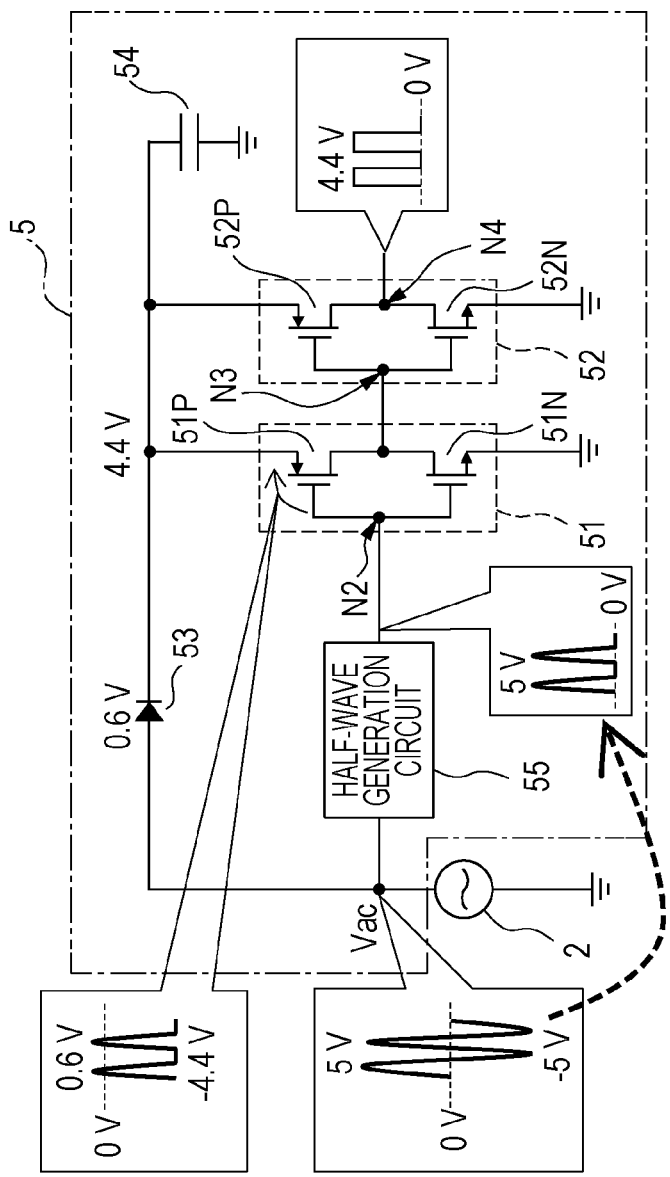
FIG. 5 is a block diagram illustrating an example of a signal conversion circuit according to the present embodiment.

In the following, a detailed description of embodiments of the signal conversion circuit, and the power source apparatus with reference to the accompanying drawings will be given. FIG. 5 is a block diagram illustrating an example of a signal conversion circuit according to the present embodiment. In FIG. 5, reference symbol 2 denotes an oscillator, reference symbol 5 denotes a signal conversion circuit, reference symbols 51 and 52 denote inverters (CMOS inverters), reference symbol 53 denotes a diode, reference symbol 54 denotes a capacitor, and reference symbol 55 denotes a half-wave generation circuit.

As illustrated in FIG. 5, in the signal conversion circuit 5 according to the present embodiment, the alternating current signal Vac from the oscillator 2 is input into the half-wave generation circuit 55 and an input node N2 of the first-stage inverter 51.

Here, the half-wave generation circuit 55 converts, for example, the alternating current signal Vac of ±5 V into a half-wave signal Vrec that varies between 5 V and 0 V and outputs the half-wave signal to the node N2. Thereby, for example, the source-to-gate voltage Vgs of the pMOS transistor 51P in the first-stage inverter 51 will not suffer from over-voltage problems, and thus transistor 51P will not be damaged.

In this regard, from the output node N4 of the second-stage inverter 52, for example, a pulse signal Vps is output, which has a voltage between 4.4 V (the voltage is lower than the maximum amplitude 5 V of Vac because the diode 53 has a voltage drop VF (=0.6 V)) and 0 V (ground voltage) with a duty ratio of about 50%. Next, a detailed description of a half-wave generation circuit 55 according to the embodiment will be given.

Figure 6:
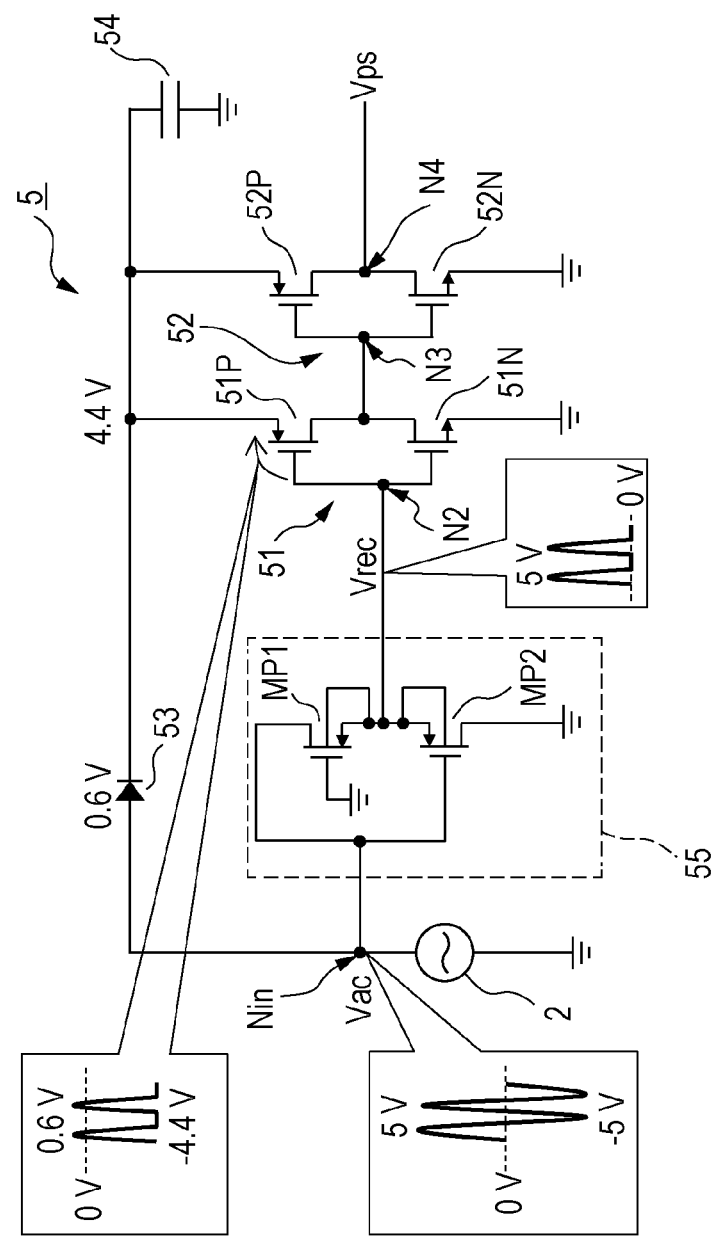
FIG. 6 is a circuit diagram illustrating a signal conversion circuit according to a first embodiment.

FIG. 6 is a circuit diagram illustrating a signal conversion circuit 5 according to a first embodiment. As illustrated in FIG. 6, in the signal conversion circuit 5 according to the first embodiment, the half-wave generation circuit 55 includes two normally off enhancement-type pMOS transistors MP1 and MP2.

The drain of the first pMOS transistor MP1 and the gate of the second pMOS transistor MP2 are connected to the node Nin (the alternating current signal input node) to which the alternating current signal Vac is input.

Also, the source and the backgate of the transistor MP1, and the source and the backgate of the transistor MP2 are commonly connected, and are connected to the input node N2 of the first-stage inverter 51. The gate of the transistor MP1, and the drain of the transistor MP2 are grounded.

Figure 7:
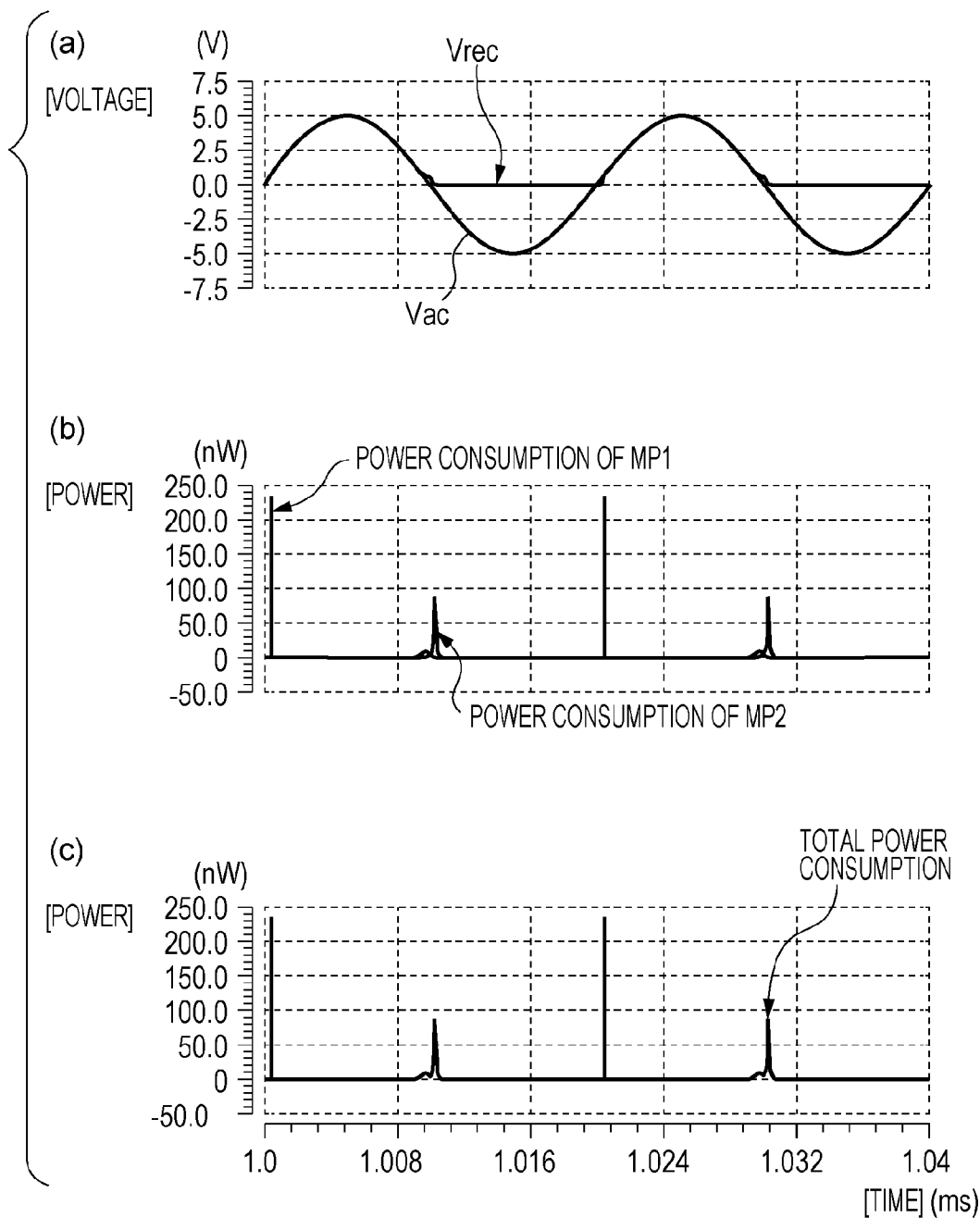
FIG. 7 is a diagram for explaining power consumption in the signal conversion circuit illustrated in FIG. 6.

FIG. 7 is a diagram for explaining power consumption in the signal conversion circuit illustrated in FIG. 6. FIG. 7(a) illustrates the voltage waveforms of the alternating current signal Vac from the oscillator 2, and the signal Vrec at the input node N2 of the inverter 51, and FIG. 7(b) illustrates power consumption of the transistors MP1 and MP2. Further, FIG. 7(c) illustrates the total power consumption of the transistors MP1 and MP2.

As illustrated in FIG. 7(a), the negative side (low potential side) signal of the alternating current signal Vac of ±5V is cut off by the signal conversion circuit 55 (the pMOS transistors MP1 and MP2), and the rectified signal is input into the input node N2 of the inverter 51 as the high potential side half-wave signal Vrec that varies between 5 V and 0 V.

At this time, the transistor MP1 consumes electric power when the alternating current signal Vac rises from 0 V to a positive voltage, and the transistor MP2 consumes electric power when the alternating current signal Vac falls from 0 V to a negative voltage. Here, the transistors MP1 and MP2 merely consume power at the moment when they are switching.

Specifically, as illustrated in FIG. 7(b), the power consumption of the transistor MP1 becomes, for example, about 240 nW at the maximum, and about 1.66 nW as the average value during one cycle when the voltage level of the alternating current signal Vac rises from 0 V to a positive voltage. Also, the power consumption of the transistor MP2 becomes, for example about 90 nW at the maximum, and about 1.15 nW as the average value during one cycle when the voltage level of the alternating current signal Vac falls from 0 V to a negative voltage.

Accordingly, as illustrated in FIG. 7(c), the total power consumption of the transistors MP1 and MP2 becomes approximately 2.81 nW (≈1.66 nW+1.15 nW) as the average value during one cycle. This becomes, for example, equal to or less than about 1/350 (equal to or less than about 0.28%) of the power consumption (1.03 μW) of the signal conversion circuit illustrated in FIG. 3, as described above, and thus the power consumption is reduced drastically.

Figure 8:
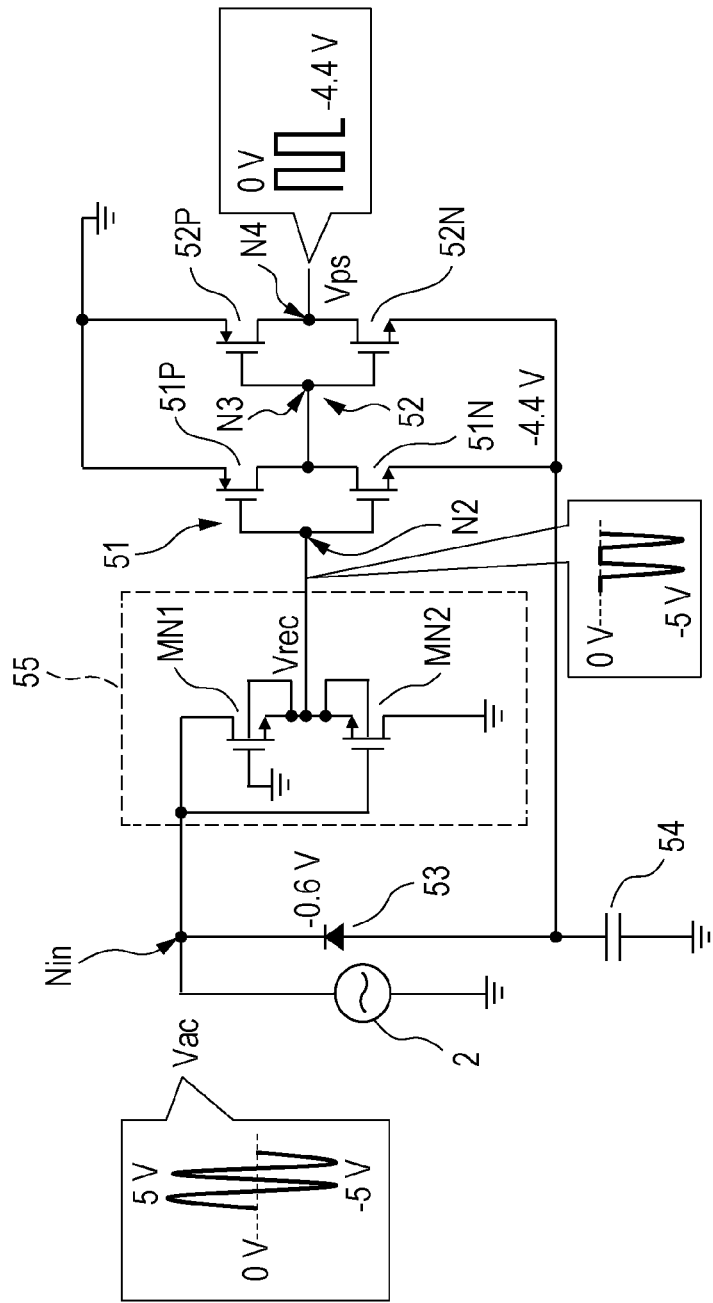
FIG. 8 is a circuit diagram illustrating a signal conversion circuit according to a second embodiment.

FIG. 8 is a circuit diagram illustrating a signal conversion circuit according to a second embodiment. The difference between FIG. 8 and the above-described FIG. 6 is obvious that the pMOS transistors MP1 and MP2 in the signal conversion circuit according to the first embodiment is replaced by nMOS transistors MN1 and MN2 which output negative pulse signals in the secondary embodiment.

That is to say, as illustrated in FIG. 8, in the signal conversion circuit according to the second embodiment, the half-wave generation circuit 55 includes two normally-off enhancement-type nMOS transistors MN1 and MN2.

The drain of the first nMOS transistor MN1 and the gate of the second nMOS transistor MN2 are connected to the node Nin to which the alternating current signal Vac is input.

Also, the source and the backgate of the transistor MN1, and the source and the backgate of the transistor MN2 are commonly connected to the input node N2 of the first-stage inverter 51. In this regard, the gate of the transistor MN1, and the drain of the transistor MN2 are grounded.

Thereby, the positive side (the high potential side) of the alternating current signal Vac of ±5 V is cut off by the signal conversion circuit 55 (the nMOS transistors MN1 and MN2), and the rectified signal is input into the input node N2 of the inverter 51 as the low potential side half-wave signal Vrec that varies between 0 V and −5 V.

Then, from the output node N4 of the second-stage inverter 52, for example, a pulse signal Vps having between 0 V (the ground voltage) and −4.4 V (the voltage is higher than the minimum amplitude −5 V of Vac because the diode 53 has a voltage drop VF (=0.6 V)) with a duty ratio of about 50%.

Here, the transistors MP1 and MP2 merely consume power at the moment when they are switching. In the same manner as the first embodiment, it is possible to drastically reduce the power consumption of the signal conversion circuit illustrated in FIG. 3, which is described above.

Figure 9:
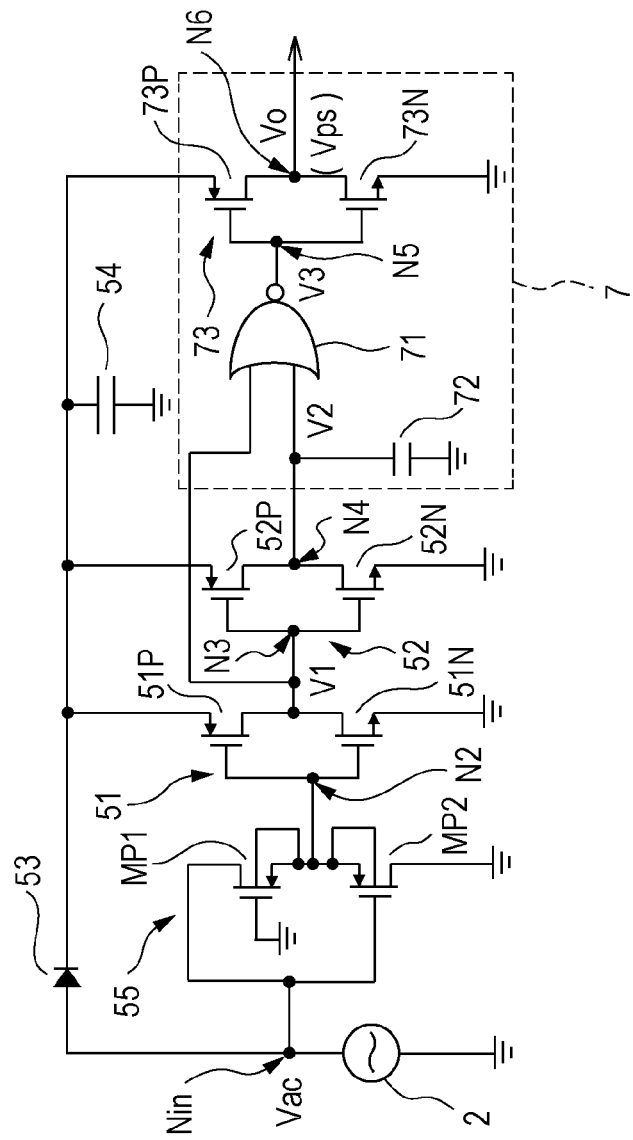
FIG. 9 is a circuit diagram illustrating a signal conversion circuit according to a third embodiment.

FIG. 9 is a circuit diagram illustrating a signal conversion circuit according to a third embodiment. The difference between FIG. 9 and FIG. 6 described above is obvious that, in the signal conversion circuit according to the third embodiment, a duty ratio control circuit 7 that controls the duty ratio of the pulse signal Vps is added to the signal conversion circuit of the first embodiment.

The duty ratio control circuit 7 controls the duty ratio of the pulse signal Vps such that, for example the switching transistor (nMOS transistor) 42 in the boost converter 4, described with reference to FIG. 1, has a longer ON time, and a shorter OFF time.

As illustrated in FIG. 9, the duty ratio control circuit 7 includes a NOR gate (logic circuit) 71, a capacitor 72, and an inverter (waveform shaping inverter) 73. The NOR gate 71 receives the output signal of the first-stage inverter 51, and the output signal of the second-stage inverter 52, and calculates NOR of the signals to output the resultant signal to the input node N5 of the inverter 73.

The capacitor 72 smooth the change of output signal (V2) of the inverter 52 to give a predetermined delay in order to control the duty ratio of the output of the NOR gate 71. The capacitor 72 is connected between the output node N4 of the inverter 52, and the ground node. Here, the inverter 73 inverts the output signal of the NOR gate 71 to output a waveform signal.

In this regard, the duty ratio control circuit 7 is not limited to the circuit illustrated in FIG. 9. For example, the logic circuit 71 may be a circuit other than a NOR gate, and likely, needless to say, the connection place of the capacitor 72, and the number of inverters 73 may also be changed in various ways.

Figure 10:
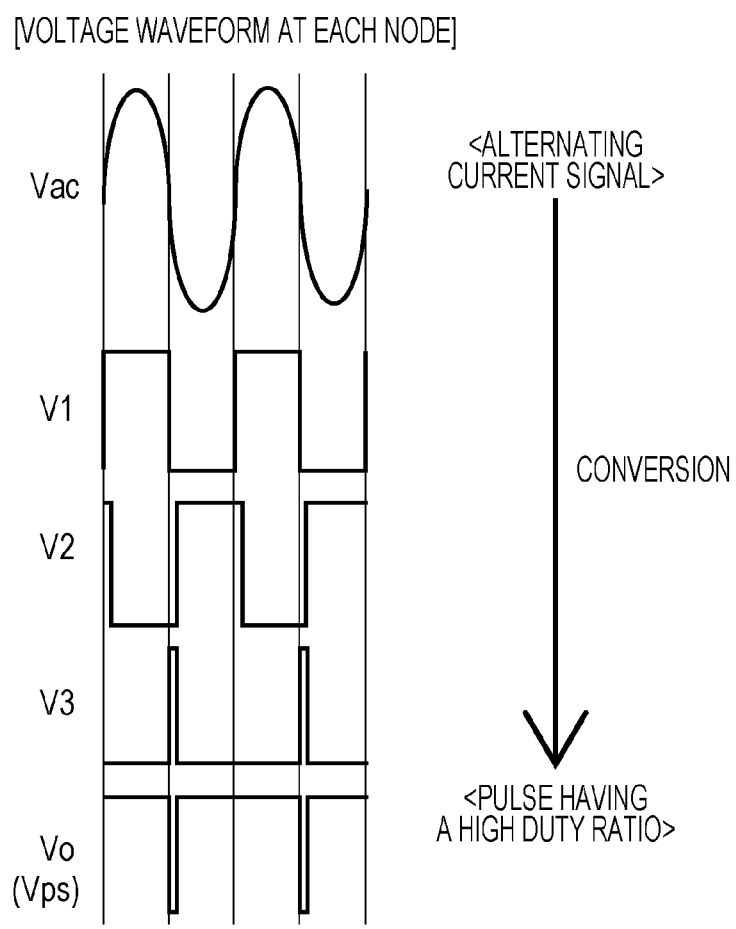
FIG. 10 is a diagram for explaining operation of the signal conversion circuit illustrated in FIG. 9.

FIG. 10 is a diagram for explaining operation of the signal conversion circuit illustrated in FIG. 9. In this regard, as illustrated in FIG. 9, reference symbol V1 denotes the output signal of the first-stage inverter 51, reference symbol V2 denotes the output signal of the second-stage inverter 52, and reference symbol V3 denotes the output signal of the NOR gate 71. Then, reference symbol V0 denotes the output signal (the pulse signal Vps) of the waveform shaping inverter 73.

As illustrated in FIG. 9 and FIG. 10, for example, the alternating sine wave signal (alternating current signal) Vac input into the input node Nin changes as follows: V1→V2→V3→V0 (Vps), and controls switching of the switching transistor (nMOS) 42 of the boost converter 4.

That is to say, the switching transistor (nMOS) 42 is controlled by the pulse signal Vps (Vo) to have an OFF time of 1% and an ON time of 99%, for example. Thereby, for example, when the input voltage (ultra-low voltage) Vin of the boost converter 4 is 20 mV, it is possible to output a power supply voltage Vo of 2 V by the boost converter 4.

Figure 11:
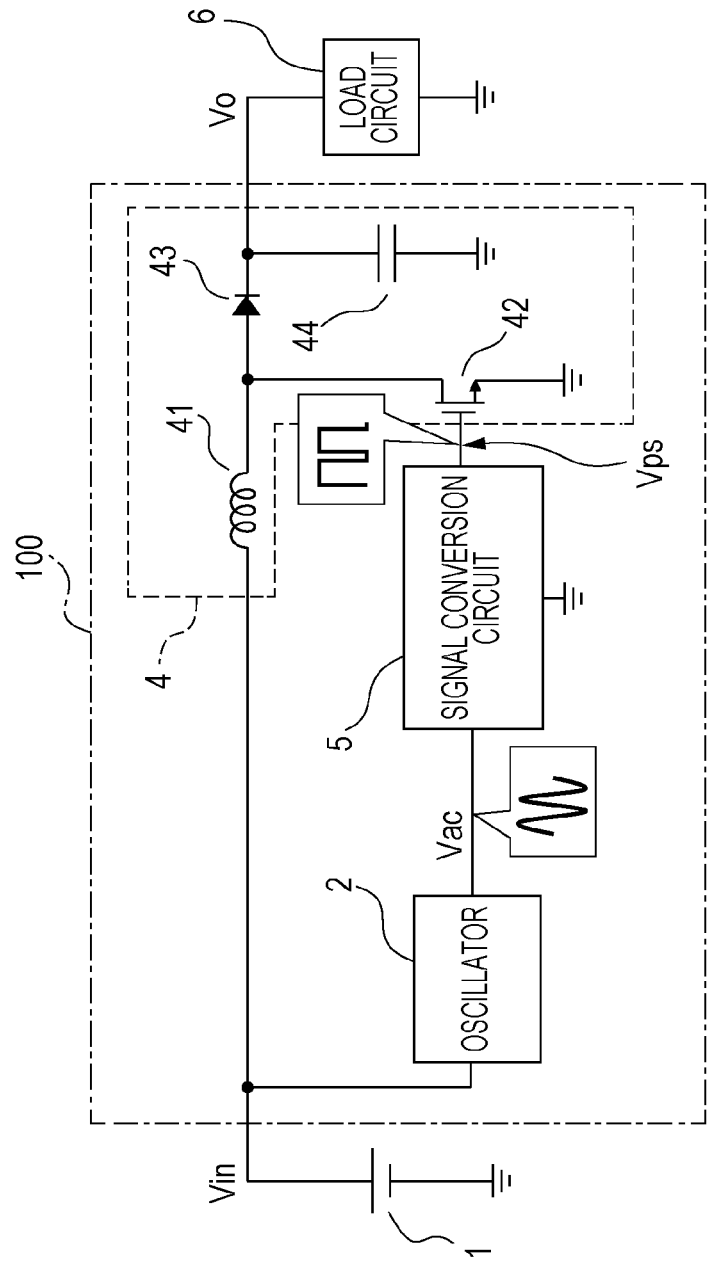
FIG. 11 is a block diagram illustrating a power supply apparatus provided with the signal conversion circuit illustrated in FIG. 9, according to an embodiment.

FIG. 11 is a block diagram illustrating a power supply apparatus provided with the signal conversion circuit illustrated in FIG. 9, according to an embodiment. It is possible to provide the signal conversion circuit 5 according to each of the embodiments described above together with the oscillator 2, and the boost converter 4 as a power supply apparatus 100.

In this regard, as described above, the voltage generation unit 1 may be an energy harvester, such as a photovoltaic generator, an electromagnetic generator, a vibration power generator, a thermoelectric generator, or the like, for example. But it is not limited to the energy harvester. Also, it is possible to implement the power supply apparatus 100 as a semiconductor chip, for example. In this case, for example, a transformer, and the like in the oscillator 2 may be an external component, as a matter of course.

In the above, descriptions of the embodiments have been made. However, all the examples and the conditions described here are given in order to help the reader understand the concept of the disclosure applied to the disclosure and the technique, and the described examples and conditions are not intended to give limitations to the range of the disclosure in particular. Also, such descriptions in the specification do not express advantages and drawbacks of the disclosure. Although the detailed description of the embodiments of the disclosure has been given, it is to be understood that various changes, replacements, alternations are possible without departing from the spirit and the scope of the disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in details, it should be understood that the various changes, substitutions, and alterations could be made hereto without departing from the spirit and scope of the invention.

What is claimed is:

1. A signal conversion circuit comprising:
   a half-wave generation circuit configured to receive an alternating current signal, and to generate a half-wave signal of a high potential side or a low potential side; and
   at least one inverter configured to receive the generated half-wave signal, and to generate a pulse signal,
   wherein the half-wave generation circuit includes a first MOS transistor and a second MOS transistor having a same conductivity type,
   a drain of the first MOS transistor and a gate of the second MOS transistor are connected to an alternating current signal input node to which the alternating current signal is input,
   a source and a backgate of the first MOS transistor and a source and a backgate of the second MOS transistor are commonly connected, and then connected to an input node of a first-stage inverter in the at least one inverter, and
   a gate of the first MOS transistor, and a drain of the second MOS transistor are grounded.

2. A power supply apparatus comprising:
   a boost converter configured to generate a power supply voltage to drive a load circuit from a voltage received from a voltage generation unit;
   an oscillator configured to receive the voltage from the voltage generation unit, and to generate an alternating current signal; and
   a signal conversion circuit including a half-wave generation circuit configured to receive the alternating current signal, and to generate a half-wave signal of a high potential side or a low potential side, and at least one inverter configured to receive the generated half-wave signal, and to generate a pulse signal;

wherein the boost converter is driven by the pulse signal output from the signal conversion circuit in order to generate the power supply voltage, and wherein the half-wave generation circuit includes a first MOS transistor and a second MOS transistor having a same conductivity type, a drain of the first MOS transistor and a gate of the second MOS transistor are connected to an alternating current signal input node to which the alternating current signal is input, a source and a backgate of the first MOS transistor and a source and a backgate of the second MOS transistor are commonly connected, and then connected to an input node of a first-stage inverter in at least the one inverter, and a gate of the first MOS transistor and a drain of the second MOS transistor are grounded.

3. The power supply apparatus according to claim 2, wherein the boost converter includes an inductor and a switching transistor for raising the input voltage, and a diode and a capacitor for smoothing the raised voltage, and the signal conversion circuit further includes a duty-ratio control circuit for controlling a duty ratio of the pulse signal so as to extend an ON time of the switching transistor in order to increase a boost-up ratio of the input voltage.

4. The power supply apparatus according to claim 3, wherein the at least one inverter includes a first-stage inverter and a second-stage inverter connected in cascade, and the duty-ratio control circuit includes a logic circuit configured to perform logic operation between an output signal of the first-stage inverter and an output signal of the second-stage inverter, and a capacitor configured to smooth the change in an output signal of the second-stage inverter to generate a predetermined delay in order to control the duty ratio of the logic circuit.

5. The power supply apparatus according to claim 4, wherein the logic circuit is a NOR gate, the capacitor is connected between an output node and a ground node of the second-stage inverter, and the duty ratio control circuit further includes a waveform shaping inverter for shaping the waveform of an output signal of the NOR gate, and an output signal of the waveform shaping inverter is input to control the switching transistor.

6. The power supply apparatus according to claim 2, wherein the voltage generation unit is an energy harvester.

* * * * *